United States Patent
Maffitt (10) Patent No.: US 10,658,022 B1
(45) Date of Patent: May 19, 2020

(54) HIGH GAIN SENSE AMPLIFIER WITH OFFSET CANCELLATION FOR MAGNETORESISTIVE RANDOM ACCESS MEMORY

(71) Applicant: INTERNATIONAL BUSINESS MACHINES CORPORATION, Armonk, NY (US)

(72) Inventor: Thomas Martin Maffitt, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/274,904

(22) Filed: Feb. 13, 2019

(51) Int. Cl.
 *G11C 11/16* (2006.01)
 *H01L 27/22* (2006.01)
 *G11C 7/08* (2006.01)

(52) U.S. Cl.
 CPC ........... *G11C 11/1673* (2013.01); *G11C 7/08* (2013.01); *G11C 11/1655* (2013.01); *H01L 27/228* (2013.01)

(58) Field of Classification Search
 None
 See application file for complete search history.

(56) References Cited

U.S. PATENT DOCUMENTS

| 7,489,575 | B2 | 2/2009 | Baker |
| 7,499,314 | B2 | 3/2009 | Yang et al. |
| 7,616,474 | B2 | 11/2009 | Baker |
| 9,330,747 | B2 | 5/2016 | Wang et al. |
| 9,343,131 | B1 * | 5/2016 | DeBrosse ........... G11C 11/1673 |
| 9,378,795 | B1 | 6/2016 | DeBrosse |
| 9,384,792 | B2 | 7/2016 | Bonaccio et al. |
| 9,691,462 | B2 | 6/2017 | Jung et al. |
| 9,852,783 | B1 | 12/2017 | Na et al. |

FOREIGN PATENT DOCUMENTS

JP  2010086638 A  4/2010

* cited by examiner

*Primary Examiner* — James G Norman
(74) *Attorney, Agent, or Firm* — Patterson + Sheridan, LLP (57) ABSTRACT

A magnetoresistive random access memory (MRAM) system is described. The system includes a sense amplifier that performs a two-phase read, including a first phase in which a first n-channel transistor is coupled to a reference resistance and a second n-channel transistor is coupled to a data resistance, and a second phase in which the first n-channel transistor is coupled to the data resistance and the second n-channel transistor is coupled to the reference resistance. The circuit further includes a first active amplifier for controlling a gate voltage of the first n-channel transistor and a second active amplifier for controlling a gate voltage of the second n-channel transistor. The circuit further includes a comparator configured to output the data state of the cell based on input of a first voltage related to a reference resistance and a second voltage related to a data resistance.

20 Claims, 8 Drawing Sheets

HIGH GAIN SENSE AMPLIFIER WITH OFFSET CANCELLATION FOR MAGNETORESISTIVE RANDOM ACCESS MEMORY

BACKGROUND

The present disclosure relates to electronic memory technology, and more specifically, though not exclusively, to a high gain sense amplifier with offset cancellation for magnetoresistive random access memory (MRAM).

MRAM is an emerging memory technology, offering non-volatility, high performance and high endurance. In one example, an MRAM cell includes two magnetic elements separated by a thin insulating layer. The polarity of one of the magnets is fixed, while the other can be changed. When the magnets are parallel the memory element has a lower resistance then the anti-parallel case. This difference in resistance can be read as memory bit in either a "0" or "1" state. The difference in resistance between states can vary depending on implementation and other factors, but may be equal to 2, i.e., a 100 percent change in resistance between the parallel and anti-parallel states.

In one form, MRAM uses spin-transfer torque (STT) techniques. A typical STT MRAM memory cell includes a magnetic tunnel junction in series with a field effect transistor (FET), which is gated by a word line. A bit line and a source line run parallel to each other and perpendicular to the word line. The bit line is connected to the magnetic tunnel junction, and the source line is connected to the FET. One memory cell along the bit line is selected by turning on its word line. When a relatively large voltage (e.g., 500 mV) is forced across the cell from bit line to source line, the selected cell's magnetic tunnel junction is written into a particular state, which is determined by the polarity of this voltage (bit line high vs. source line high).

When the cell is in a logic zero (0) or parallel state, its magnetic tunnel junction resistance is lower than when the cell is in a logic one (1) or anti-parallel state. Typical magnetic tunnel junction resistance values could include R0=5 KΩ and R1=10 KΩ A selected cell is read by sensing the resistance from bit line to source line. The "sense" or "read" voltage is much lower than the write voltage in order to clearly distinguish write and read operations, and to avoid inadvertently disturbing the cell during a read operation. Thus, sensing methodologies are capable of accurately sensing very low read voltage (e.g., less than 50 mV). The combination of a small difference in resistance and sensing the difference at a low voltage makes the design of a MRAM read system very challenging.

SUMMARY

Embodiments described herein include a sense amplifier circuit for sensing a data state of a data cell. The sense amplifier circuit includes a first leg that includes a first n-channel transistor and a second leg that includes a second n-channel transistor. The sense amplifier circuit is configured to perform a two-phase read, including a first phase in which the first n-channel transistor is coupled to a reference resistance element and the second n-channel transistor is coupled to a data resistance element, and a second phase in which the first n-channel transistor is coupled to the data resistance element and the second n-channel transistor is coupled to the reference resistance element. The sense amplifier circuit further includes a first active amplifier for controlling a gate voltage of the first n-channel transistor and a second active amplifier for controlling a gate voltage of the second n-channel transistor. The sense amplifier circuit further includes a comparator circuit configured to output the data state of the data cell based on input of a first voltage related to a reference resistance and a second voltage related to a data resistance.

Embodiments described herein further include a magnetoresistive random access memory (MRAM) system. The MRAM system includes a plurality of MRAM data cells. The MRAM system further includes a sense amplifier circuit for sensing a data state of a data cell of the plurality of MRAM data cells. The sense amplifier circuit further includes a first leg including a first n-channel transistor and a second leg including a second n-channel transistor. The sense amplifier circuit is configured to perform a two-phase read, including a first phase in which the first n-channel transistor is coupled to a reference resistance element and the second n-channel transistor is coupled to a data resistance element, and a second phase in which the first n-channel transistor is coupled to the data resistance element and the second n-channel resistance is coupled to the reference resistance element. The sense amplifier circuit further includes a first active amplifier for controlling a gate voltage of the first n-channel transistor and a second active amplifier for controlling a gate voltage of the second n-channel transistor. The sense amplifier circuit further includes a comparator circuit configured to output the data state of the data cell based on input of a first voltage related to a reference resistance and a second voltage related to a data resistance.

Embodiments described herein further include a method of reading data from a magnetoresistive random access memory (MRAM) system. The method includes performing a two phase read of a data state of a data cell using a sense amplifier circuit. The sense amplifier circuit includes a first leg including a first n-channel transistor and a second leg including a second n-channel transistor. The sense amplifier circuit further includes a first active amplifier, a second active amplifier, and a comparator circuit. During the first phase of the two phase read the first n-channel transistor is coupled to a reference resistance element and the second n-channel transistor is coupled to a data resistance element. During the second phase of the two phase read the first n-channel transistor is coupled to the data resistance element and the second n-channel resistance is coupled to the reference resistance element. The first active amplifier is configured to control a gate voltage of the first n-channel transistor and the second active amplifier is configured to control a gate voltage of the second n-channel transistor. The comparator circuit is configured to output the data state of the data cell based on input of a first voltage related to a reference resistance and a second voltage related to a data resistance.

DETAILED DESCRIPTION

As noted above, designing magnetoresistive random access memory (MRAM) read system can be very challenging. In particular, designing a sense amplifier suitable to detect the relatively small difference in resistance and at a low voltage can be challenging. For example, FET mismatch between transistors in the sense amplifier can be significant enough to affect read accuracy. Further, techniques suitable to correct for FET mismatch can create additional errors and affect read accuracy. One or more techniques disclosed herein relate to an improved sense amplifier for an MRAM system to compensate for FET mismatch and other errors. While the illustrated embodiments focus on MRAM, one or more of the techniques disclosed herein are also suitable for other memory systems, particularly systems involving low differential resistance or low read voltage.

Figure 1:
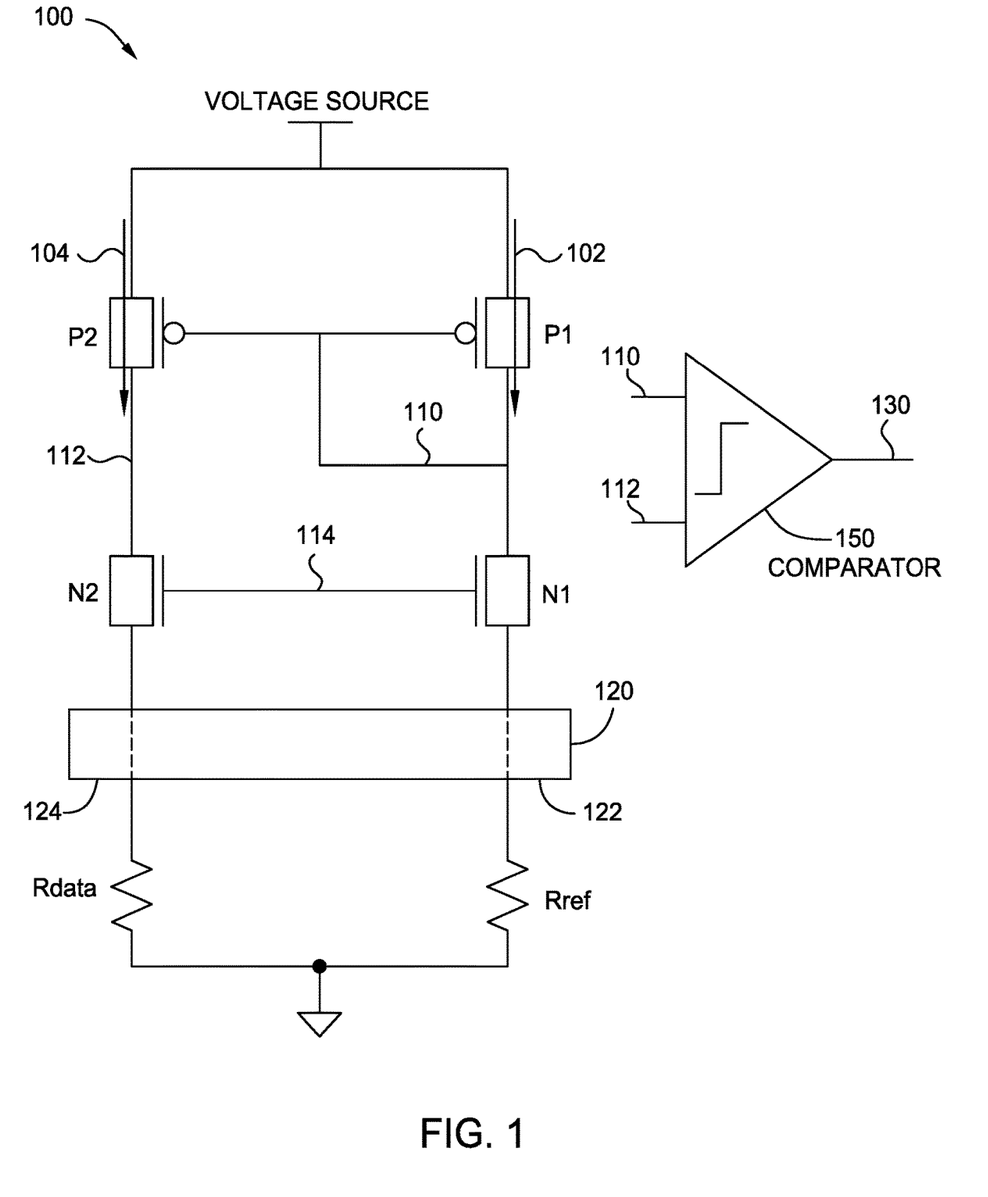
FIG. 1 illustrates an MRAM sense amplifier, according to one embodiment described herein.

FIG. 1 illustrates an MRAM sense amplifier 100, according to one embodiment described herein. The sense amplifier 100 is part of the read circuit of an MRAM system and is used when reading data from an MRAM cell. Reference and data currents are created by reference and data cells, respectively, at a fixed voltage. The change in current between the data and reference cells creates a voltage difference which corresponds to either a "0" or "1" data state.

The sense amplifier 100 includes a column decoder/multiplexer 120 and bit lines 122 and 124. The bit line 122 is a reference bit line while the bit line 124 is a data bit line. The resistor Rref is used for the reference bit line while the resistor Rdata is used for the data bit line. A pair of n-channel transistors N1 and N2 form a source-follower circuit that clamps the bit lines (or source lines depending on the preferred read polarity) to the target read voltage at the clamp 114. The difference between the data cell current 104 and the reference cell current 102 is converted to a voltage difference by a p-channel (positive channel FET) current mirror load circuit made up of p-channel transistors P1 and P2. This voltage difference between 110 and 112 is sensed by a comparator 150 to produce the digital sense amplifier output 130 (e.g., a "0" or "1" conveying the value stored by the MRAM cell).

FIG. 1 illustrates a 2-legged sense amplifier, with one data leg and one reference leg. Alternatively, the sense amplifier may be 3-legged, with one data leg and two reference legs. In this alternative, the values of the two reference legs are averaged and compared with the data leg.

The techniques illustrated in FIG. 1, however, are sensitive to FET mismatch between the p-channel transistors P1 and P2 and between the n-channel transistors N1 and N2. For example, in FIG. 1, a reference current 102 is sourced from the p-channel transistor P1 while a reference current 104 is sourced from the p-channel transistor P2. In an embodiment, FET mismatch between P1 and P2 can lead to variance between reference currents 102 and 104. FET mismatch is a common phenomenon influencing the performance of analog circuits. Despite the use of layout techniques to minimize mismatch, any two seemingly identical FETs will have slightly different values of threshold voltage and transconductance due to local variations in device dimensions, gate oxide thickness, channel doping, and other physical parameters. These mismatches result in finite random offsets in circuits which would otherwise have zero offset. Furthermore, as FET device technology scales, the sensitivity to FET mismatch can increase.

In the case of an MRAM sense amplifier (e.g., the sense amplifier 100), FET mismatch results in a degradation of read margin. The threshold data cell resistance (the data cell resistance at which the sense amplifier switches from an output of 0 to an output of 1) is moved from its ideal value. For example, the output 130 is proportional to the difference between the reference and data current, but with two error terms from the P1/P2 and N1/N2 pair mismatch errors. This error can be significant, causing sense amplifier to sense amplifier variations and as a consequence a variation in the signal margin and ultimately read robustness, One possible solution is to trim out the effects of FET mismatch in an MRAM sense amplifier. In essence, trimming can allow the threshold data cell resistance to be moved back to a near ideal value on a sense amplifier by sense amplifier. But this has disadvantages. Trimming requires significant test time and circuit area. Further, trimming does not correct for FET parameter shifts which occur after initial test and trimming of the part. Still further, trimming cannot correct for transient noise effects, which are random in nature with respect to time.

Figure 2:
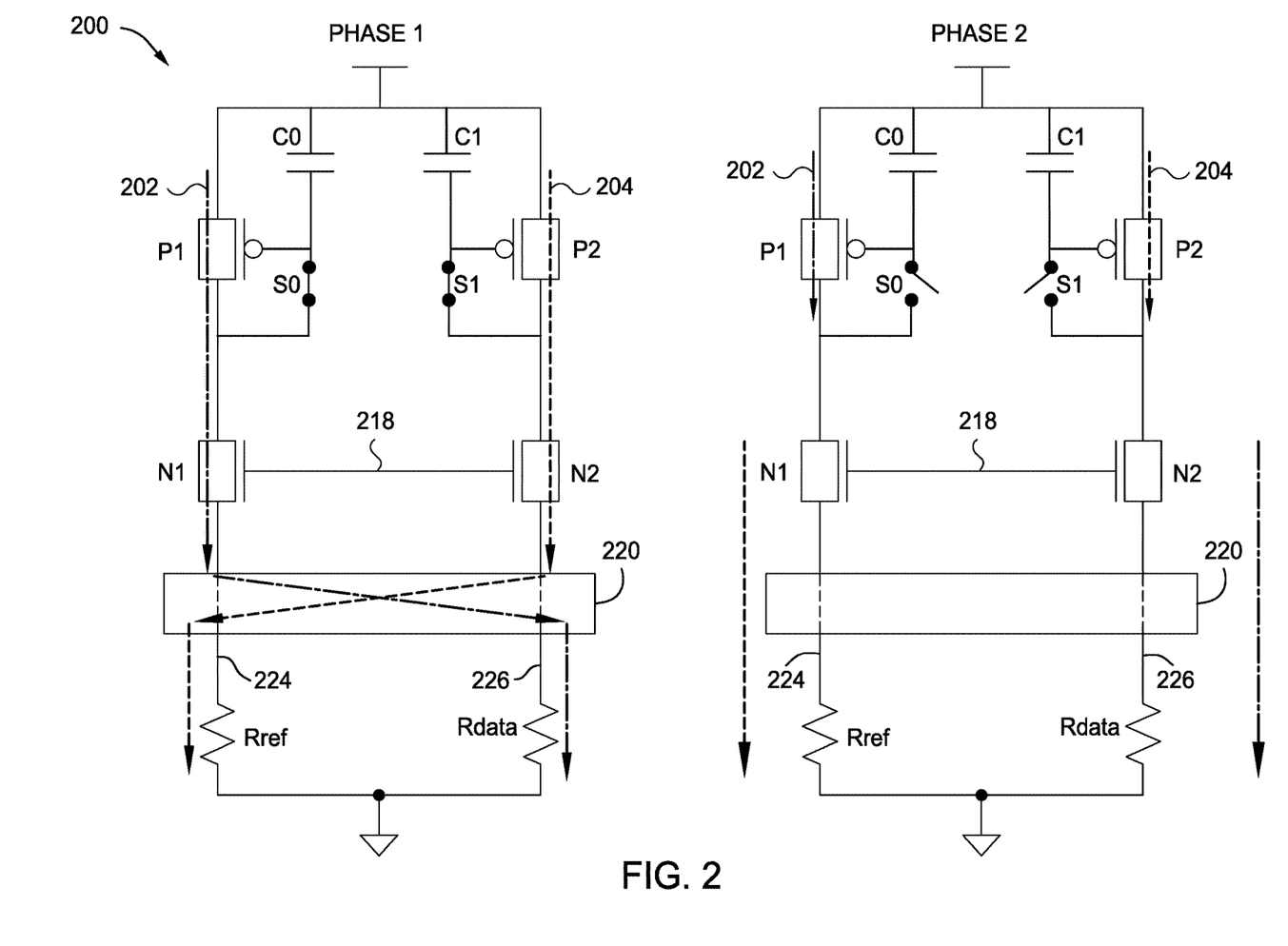
FIG. 2 illustrates an improved MRAM sense amplifier, according to one embodiment described herein.

FIG. 2 illustrates an improved MRAM sense amplifier 200, according to one embodiment described herein. In an embodiment, FIG. 2 addresses FET mismatch by introducing a 2 phase, "sample and hold" technique, as illustrated. In this solution, the data and reference loads are switched between the left and right legs of the sense amplifier 200 between phase 1 and 2, as the diode connections S0 and S1 coupled to the p-channel devices P1 and P2 are opened. The gate voltage of the p-channel device during phase 1 is stored on the capacitors C0 and C1. As a result, during phase 2 the load devices P1 and P2 become current sources based on the phase 1 load. That is, during phase 1 the capacitors C0 and C1 store the gate voltages of P1 and P2, respectively. During phase 2, the switches S0 and S1 open, and the p-channel transistors P1 and P2 become current sources.

Further, during phase 1 the p-channel transistor P1 sources the data current 202 while the p-channel transistor P2 sources the reference current 204. During phase 1 the column decoder/multiplexer 220 is configured to swap legs, so that the output from the n-channel transistor N1 is coupled to Rdata while the output from the n-channel transistor N2 is coupled to Rref. This means that during phase 1, the reference current 204 flows through the right leg of the sense amplifier before reaching the column decoder/multiplexer 220, and the reference current is then swapped to flow through the resistor Rref. Further during phase 1 the data current 202 flows through the left leg of the sense amplifier before reaching the column decoder/multiplexer 220, and the reference current is then swapped to flow through the resistor Rdata. During phase 2, the column decoder/multiplexer 220 stops swapping legs, so that the data current 202 flows through the resistor Rref while the reference current 204 flows through the resistor Rdata.

Since the loads switch from phase 1 to 2, the source current, including the device pair mismatch current offsets of the left and right legs of the sense amplifier, are sourced to both the data and reference loads. This leads to a two times increase in signal and a cancellation of the device mismatch errors, compared to the techniques illustrated in FIG. 1.

In the techniques illustrated in FIG. 2, however, the source follower gate voltage (e.g., the gate voltage at n-channel transistors N1 and N2) is fixed at a value that holds the bit lines 224 and 226 to a target read voltage for loads equal to the target reference load. Consequently, until Rdata is approximately equal to Rref, the bit line offset voltage between phase 1 and phase 2 introduces additional error. That is, the source voltage of N1 is not equal to the source voltage of N2 when Rref is not equal to Rdata.

Figure 3:
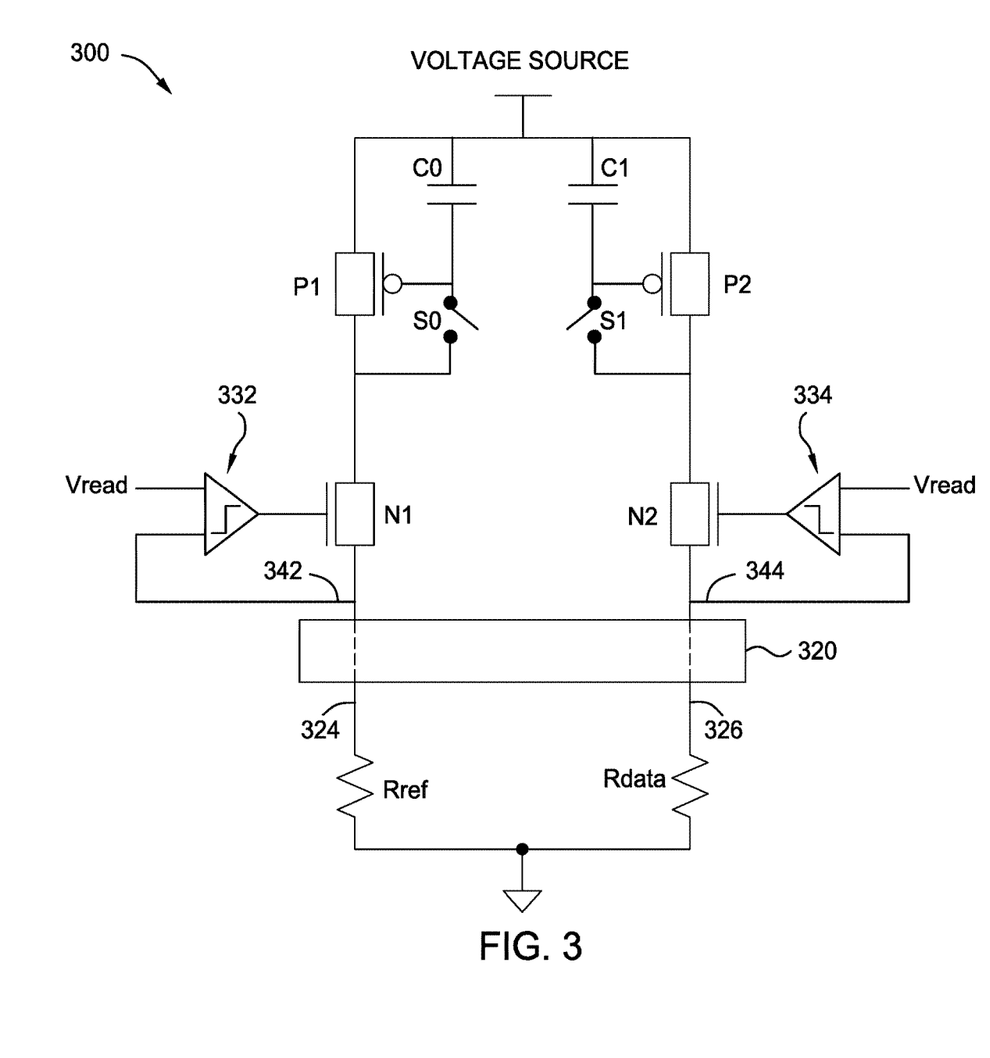
FIG. 3 illustrates a further improved MRAM sense amplifier, according to one embodiment described herein.

FIG. 3 illustrates a further improved MRAM sense amplifier 300, according to one embodiment described herein. The sense amplifier 300 addresses the problems associated with the techniques illustrated in FIG. 2 by actively, and independently, controlling the gate voltage of the source follower devices (e.g., N1 and N2). This holds the bit line voltage during both phase 1 and phase 2 to the target read voltage (e.g., Vread), thereby alleviating the additional voltage error at the outputs of the n-channel transistors discussed above.

The sense amplifier 300 includes the addition of the active amplifiers 332 and 334. The addition of these amplifiers holds the bit line voltage at 342 and 344 to the target read voltage, independent of the load resistances (e.g., Rref and Rdata). That is, instead of the voltage clamp 218 illustrated in FIG. 2, the sense amplifier 300 includes the active amplifiers 332 and 334. The amplifier 332 acts as a comparator, taking the read voltage Vread as one input and the output voltage from the n-channel transistor N1 (e.g., the voltage at 342) as another input. The amplifier 332 holds the gate of the n-channel transistor N1 at the target read voltage Vread. Similarly, the amplifier 334 acts as a comparator for the read voltage Vread and the output voltage from the n-channel transistor N2 (e.g., the voltage 344). The amplifier 334 holds the gate of the n-channel transistor N2 at the target read voltage Vread. The sense amplifier 300 further includes a column decoder/multiplexer 320 and bit lines 324 and 326.

Figure 4:
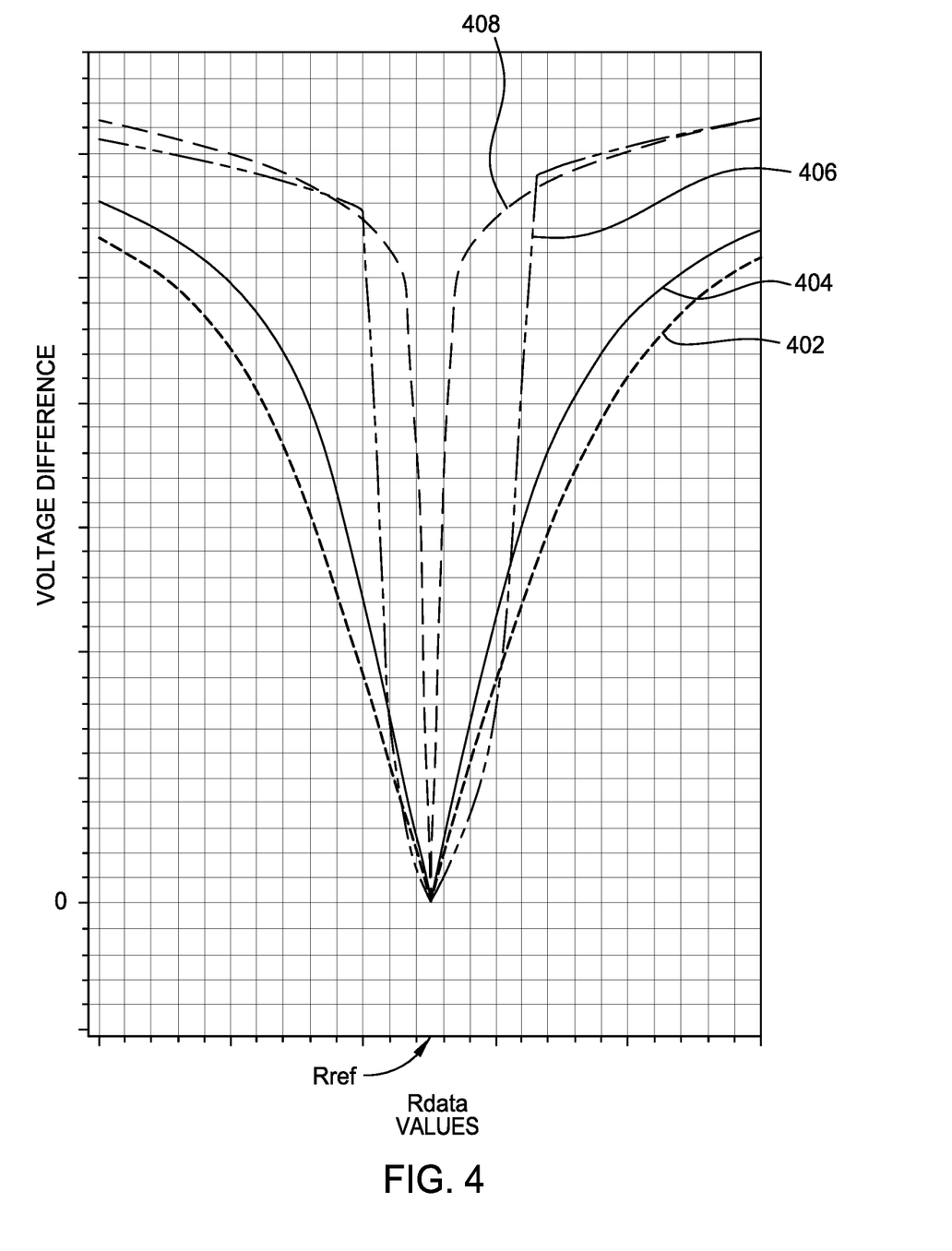
FIG. 4 illustrates a simulation of operation of an improved MRAM sense amplifier, according to one embodiment described herein.

FIG. 4 illustrates a simulation of operation of an improved MRAM sense amplifier, according to one embodiment described herein. The x-axis represents a sweep of Rdata values (e.g., from 5 kΩ to 10 kΩ). The y-axis represents the voltage difference input to the comparator (e.g., the difference between 110 and 112 illustrated in FIG. 1). The reference resistance falls in the middle of the Rdata sweep (e.g., at 7.5 kΩ) so the y-axis value should approach 0 in the middle of the x-axis.

The plot 402 illustrates a configuration without active amplifiers driving the source-follower transistors (e.g., the configuration illustrated in FIG. 2). As can be seen from the graph, the comparator value in the y-axis rolls off as the value of Rdata varies from the value of Rref, potentially introducing read errors. The plot 404 illustrates the configuration of FIG. 3, but with the amplifiers controlling the gate voltage of the source-follower transistors (e.g., the amplifiers 332 and 334 illustrated in FIG. 3) during Phase 1 only. During phase 2, the gate voltage of the source-follower transistors (e.g., N1 and N2) is fixed. As can be seen, this is an improvement over the plot 402 but the comparator value in the y-axis still rolls off as the value of Rdata varies from the value of Rref. The plot 406 illustrates the configuration of FIG. 3, with the amplifiers controlling the gate voltage of the source follower transistors during Phase 2 only. During Phase 1, the gate voltage of the source-follower transistors (e.g., N1 and N2) is fixed. This is a further improvement over the plots 402 and 404 but the comparator value in the y-axis still rolls off before the value of Rdata reaches Rref.

The plot 408 illustrates the configuration of FIG. 3, with the amplifiers (e.g., the amplifiers 332 and 334) controlling the gate voltages (e.g., the gate voltages of N1 and N2) during both phase 1 and phase 2. As can be seen, the plot 408 is a further improvement over the plots 402, 404, and 406, and the comparator value in the y-axis approaches 0 more abruptly as Rdata approaches Rref.

Figure 5:
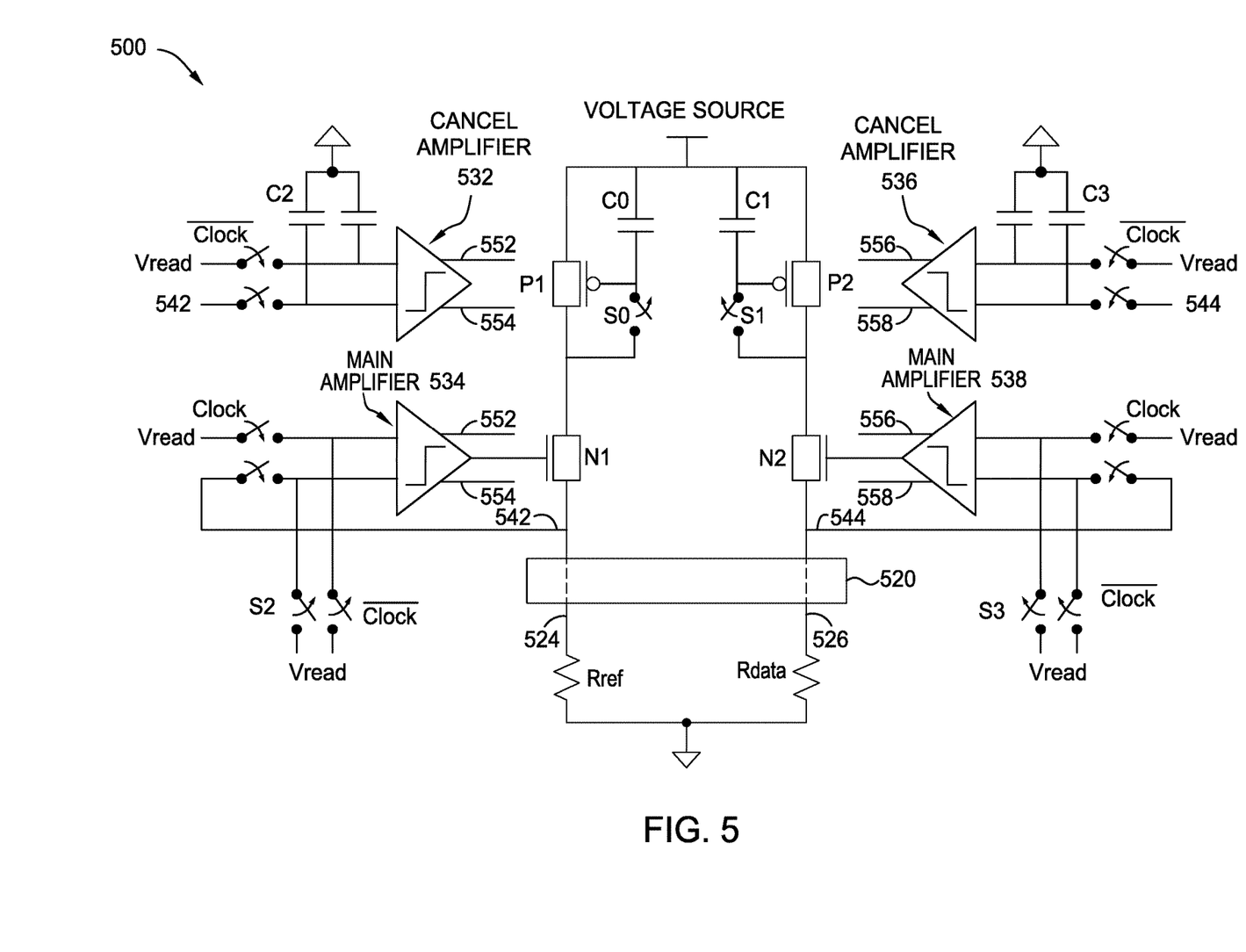
FIG. 5 illustrates a further improved MRAM sense amplifier, according to one embodiment described herein.

FIG. 5 illustrates a further improved MRAM sense amplifier 500, according to one embodiment described herein. In particular, FIG. 5 represents a further potential improvement over the configuration illustrated in FIG. 3. FIG. 5 illustrates the addition of secondary offset cancel amplifiers 532 and 536. In an embodiment, the amplifier driving the source-follower gates (e.g., the gates to N1 and N2) acts as a two stage amplifier, with the output of the first stage connected in parallel with the output of a like single stage cancellation amplifier. As illustrated in FIG. 5, the switches S0, S1, S2, and S3 close when the input signal is high.

Starting with the left leg of the sense amplifier 500, during the offset cancelling phase (e.g., when the inverse clock signal $\overline{\text{clock}}$ is high) the input of the main amplifier 534 is connected to Vread (e.g., because the switch S2 is closed) and the outputs 552 and 554 are connected to the offset canceling amplifier 532. When the cancellation phase ends ($\overline{\text{clock}}$ goes low and clock goes high) the offset error of the main amplifier 534 is stored on capacitors C2 as inputs to the cancel amplifier 532. The main amplifier 534 is reconnected to the bit line (e.g., 542) at the same time, so that the inputs to the main amplifier 534 are Vread and the feedback from 542.

The same is true of the right leg of the sense amplifier 500. During the offset cancelling phase (e.g., when the inverse clock signal $\overline{\text{clock}}$ is high) the input of the main amplifier 538 is connected to Vread (e.g., because the switch S3 is closed) and the outputs 556 and 558 are connected to the offset canceling amplifier 536. When the cancellation phase ends ($\overline{\text{clock}}$ goes low and clock goes high) the offset error of the main amplifier 538 is stored on capacitors C3 as inputs to the cancel amplifier 536. The main amplifier 538 is reconnected to the bit line (e.g., 544) at the same time, so that the inputs to the main amplifier 534 are Vread and the feedback from 544.

Because the cancellation amplifiers 532 and 536 are connected in parallel with the main amplifiers 534 and 538, the mismatch errors of the main amplifiers 534 and 538 are nulled out by the cancellation amplifiers 532 and 536. As consequence, the error introduced by the main amplifiers 534 and 538 approaches zero and the full signal is proportional to 2 times the difference between the reference current and the data current. The sense amplifier 500 further includes a column decoder/multiplexer 520 and bit lines 524 and 526.

In the embodiment illustrated in FIG. 5, the cancellation is performed every read cycle when clock is low (meaning $\overline{\text{clock}}$ is high)—that is, between the active portions of the read cycle. If the read cycle is too short to allow cancellation between reads, clock/$\overline{\text{clock}}$ can be replaced with inputs sample/$\overline{\text{sample}}$ that occur only before the first read cycle. In this embodiment the cancellation is done only once as memory array bank goes from standby to active. In this embodiment, continuous reads may be interrupted to do a periodic re-cancellation, before continuing the read operation.

Figure 6:
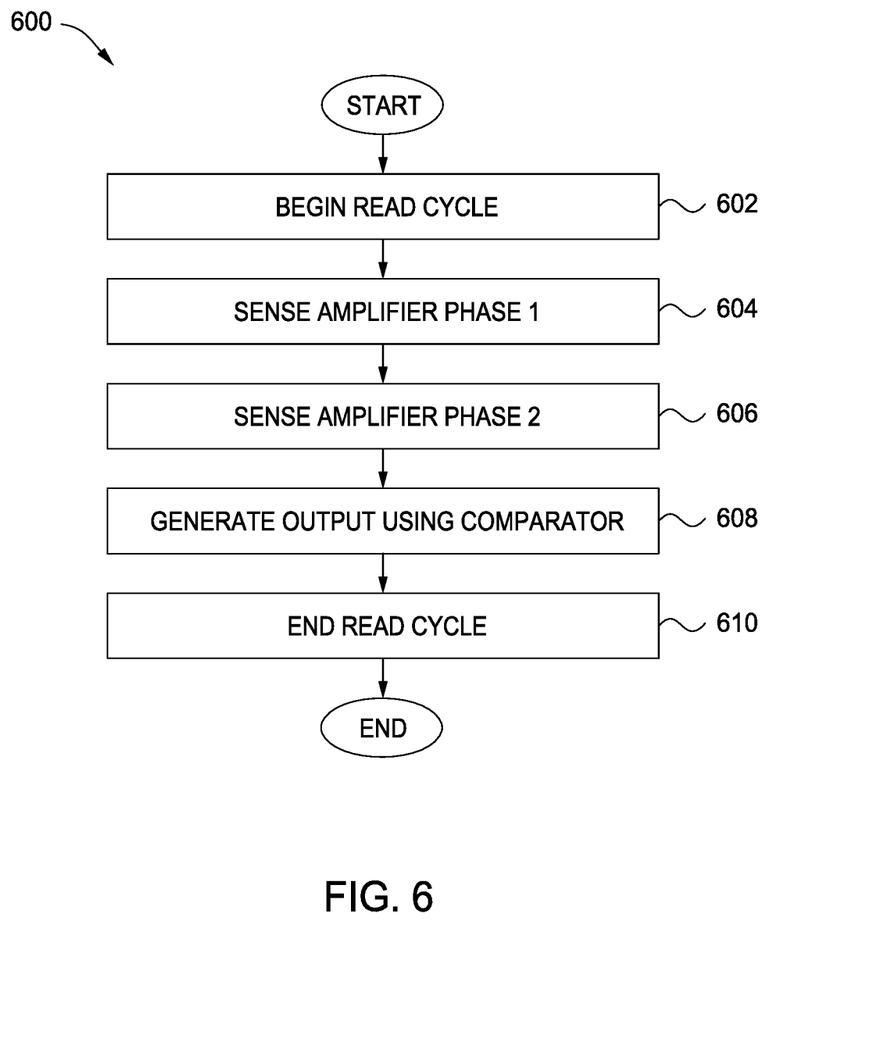
FIG. 6 is a flowchart illustrating a two phase MRAM sense amplifier, according to one embodiment described herein.

FIG. 6 is a flowchart illustrating a two phase MRAM sense amplifier, according to one embodiment described herein. For example, the flow illustrated in FIG. 6 corresponds with operation of the MRAM sense amplifiers illustrated in FIGS. 2, 3, and 5. At block 602, a read cycle begins. At block 604, the sense amplifier undertakes phase 1. As discussed above in relation to FIG. 2, data and reference loads in the sense amplifier are switched between the left and right legs between phase 1 and 2, as switches coupled to the p-channel transistors open. During phase 1, the switches are closed and a multiplexer swaps the data and reference loads across legs of the sense amplifier (e.g., from a left leg to a right leg, and vice-versa).

At block 606, the sense amplifier undertakes phase 2. In this phase, the switches coupled to the p-channel transistors are open and the multiplexer no longer swaps the data and reference loads between legs. This compensates for any FET mismatch between the pairs of n-channel and p-channel transistors. Further, as discussed above with regard to FIGS. 3 and 4, active amplifiers can be used to dynamically drive the gates of the n-channel transistors to further compensate for voltage differences between the bit lines.

At block 608, a comparator generates the digital output by comparing input voltages. For example, as illustrated in FIG. 1 a comparator can compare the output voltages of the p-channel transistors on each leg of the sense amplifier, and can correspondingly output a "0" or "1" depending on the voltage difference. This represents the data stored in the memory cell. At block 610, the read cycle ends.

Figure 7A:
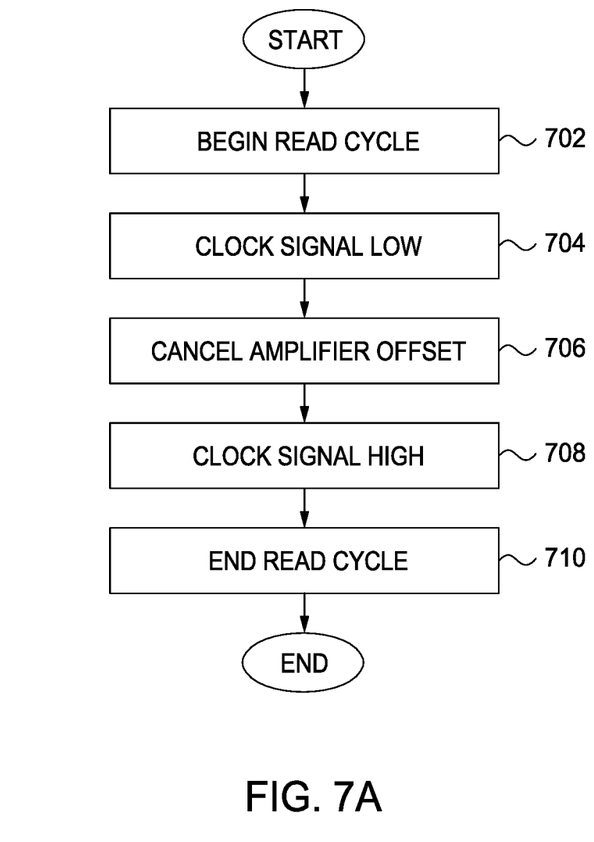
FIGS. 7A-7B are flowcharts illustrating active amplifier cancellation in a two phase MRAM sense amplifier, according to one embodiment described herein.
Figure 7B:
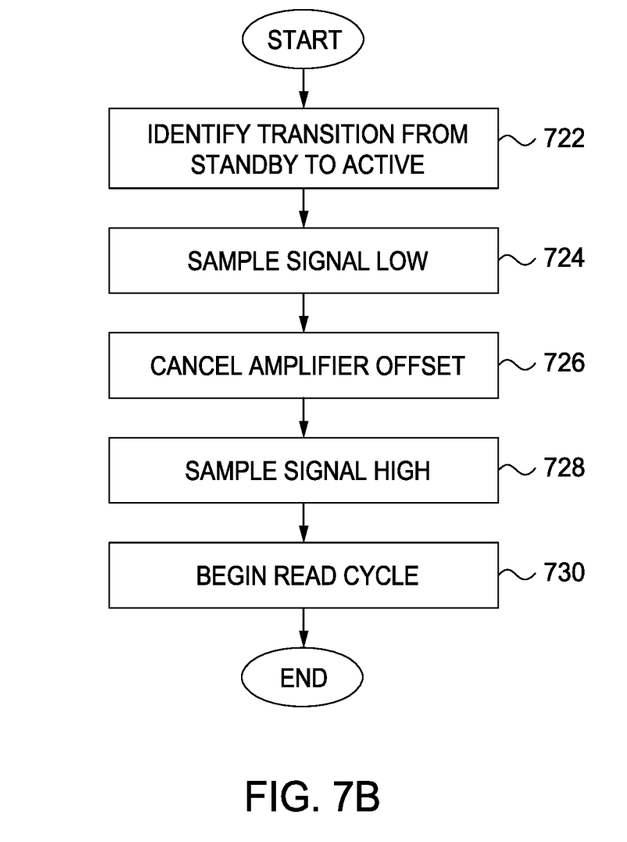

FIGS. 7A-7B are flowcharts illustrating active amplifier cancellation in a two phase MRAM sense amplifier, according to one embodiment described herein. In an embodiment, FIGS. 7A and 7B correspond with the circuit illustrated in FIG. 5. FIG. 7A illustrates an embodiment in which amplifier cancellation occurs during each read cycle. At block 702, a read cycle begins. At block 704, the clock signal is low. As discussed above with regard to FIG. 5, the clock signal falling low initiates the amplifier cancellation phase. At block 706, the sense amplifier cancels any amplifier offset stemming from use of the active amplifiers to drive the gates of the n-channel transistors. This is discussed above with regard to FIG. 5. At block 708 the clock signal is high. This ends the amplifier cancellation phase. At block 710, the read cycle ends.

FIG. 7B illustrates an alternative embodiment in which amplifier cancellation occurs prior to beginning a read cycle. At block 722, the sense amplifier identifies a transition from standby to active in a memory array bank. This signals that a read cycle is about to begin. At block 724, a sample signal is low. As discussed above with regard to FIG. 5, in this embodiment a sample signal falling low initiates the amplifier cancellation phase. At block 726, the sense amplifier cancels any amplifier offset stemming from use of the active amplifiers to drive the gates of the n-channel transistors. This is discussed above with regard to FIG. 5. At block 728 the sample signal is high. This ends the amplifier cancellation phase. At block 730, the read cycle begins. FIG. 7B illustrates amplifier cancellation prior to beginning a read cycle. Alternatively, or in addition, the read cycle can be interrupted and amplifier cancellation can occur during the interruption.

Figure 8:
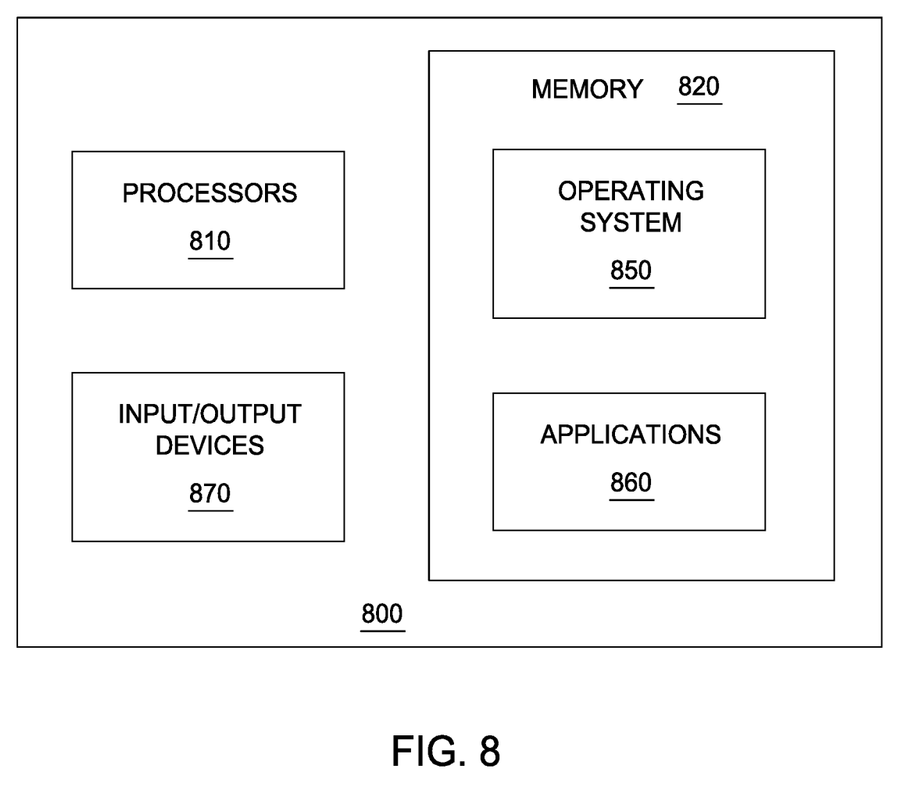
FIG. 8 illustrates an example computer, according to one embodiment described herein.

FIG. 8 illustrates an example computer 800, according to one embodiment described herein. Various methods, procedures, modules, flow diagrams, tools, applications, circuits, elements, and techniques discussed herein may also incorporate and/or utilize the capabilities of the computer 800. Moreover, capabilities of the computer 800 may be utilized to implement features of exemplary embodiments discussed herein. One or more of the capabilities of the computer 800 may be utilized to implement, incorporate, to connect to, and/or to support any element discussed herein (as understood by one skilled in the art) in FIGS. 1-7.

Generally, in terms of hardware architecture, the computer 800 may include one or more processors 810, computer readable storage memory 820, and one or more input and/or output (I/O) devices 870 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 810 is a hardware device for executing software that can be stored in the memory 820. The processor 810 can be virtually any custom made or commercially available processor, a central processing unit (CPU), a data signal processor (DSP), or an auxiliary processor among several processors associated with the computer 800, and the processor 810 may be a semiconductor based microprocessor (in the form of a microchip) or a microprocessor. Note that the memory 820 can have a distributed architecture, where various components are situated remote from one another, but can be accessed by the processor 810. In an embodiment, the memory 820 can be formed using MRAM and using MRAM sense amplifiers as discussed in one or more embodiments herein.

The software in the computer readable memory 820 may include one or more separate programs, each of which comprises an ordered listing of executable instructions for implementing logical functions. The software in the memory 820 includes a suitable operating system (O/S) 850 and one or more applications 860 of the exemplary embodiments. As illustrated, the application 860 comprises numerous functional components for implementing the features, processes, methods, functions, and operations of the exemplary embodiments. The application 860 of the computer 800 may represent numerous applications, agents, software components, modules, interfaces, controllers, etc., as discussed herein but the application 860 is not meant to be a limitation.

The operating system 850 may control the execution of other computer programs, and provides scheduling, input-output control, file and data management, memory management, and communication control and related services.

The I/O devices 870 may include input devices (or peripherals) such as, for example but not limited to, a mouse, keyboard, scanner, microphone, camera, etc. Furthermore, the I/O devices 870 may also include output devices (or peripherals), for example but not limited to, a printer, display, etc. Finally, the I/O devices 870 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 870 also include components for communicating over various networks, such as the Internet or an intranet. The I/O devices 870 may be connected to and/or communicate with the processor 810 utilizing Bluetooth connections and cables (via, e.g., Universal Serial Bus (USB) ports, serial ports, parallel ports, FireWire, HDMI (High-Definition Multimedia Interface), PCIe, InfiniBand®, or proprietary interfaces, etc.).

When the computer 800 is in operation, the processor 810 is configured to execute software stored within the memory 820, to communicate data to and from the memory 820, and to generally control operations of the computer 800 pursuant to the software. The application 860 and the O/S 850 are read, in whole or in part, by the processor 810, perhaps buffered within the processor 810, and then executed.

It is understood that the computer 800 includes non-limiting examples of software and hardware components that may be included in various devices, servers, and systems discussed herein, and it is understood that additional software and hardware components may be included in the various devices and systems discussed in exemplary embodiments.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements described above, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A sense amplifier circuit for sensing a data state of a data cell, comprising:
    a first leg comprising a first n-channel transistor and a second leg comprising a second n-channel transistor, wherein the sense amplifier circuit is configured to perform a two-phase read comprising:
        a first phase in which the first n-channel transistor is coupled to a reference resistance element and the second n-channel transistor is coupled to a data resistance element, and
        a second phase in which the first n-channel transistor is coupled to the data resistance element and the second n-channel transistor is coupled to the reference resistance element;
    a first active amplifier for controlling a gate voltage of the first n-channel transistor and a second active amplifier for controlling a gate voltage of the second n-channel transistor; and
    a comparator circuit configured to output the data state of the data cell based on input of a first voltage related to a reference resistance and a second voltage related to a data resistance.

2. The sense amplifier circuit of claim 1, wherein the first active amplifier is configured to control the gate voltage of the first n-channel transistor based on feedback from the first n-channel transistor.

3. The sense amplifier circuit of claim 1, further comprising:
    a first cancellation amplifier connected in parallel with the first active amplifier; and
    a second cancellation amplifier connected in parallel with the second active amplifier.

4. The sense amplifier circuit of claim 3, wherein the first cancellation amplifier comprises a first input coupled to a first capacitor and a second input coupled to a second capacitor.

5. The sense amplifier circuit of claim 4, wherein the first input is further coupled to a first switch configured to selectively couple the first input to a voltage source and wherein the second input is further coupled to a second switch configured to selectively couple the second input to feedback from the first n-channel transistor.

6. The sense amplifier circuit of claim 5, wherein the first switch and the second switch are each configured to close based on a clock signal.

7. The sense amplifier circuit of claim 3, wherein the sense amplifier circuit is configured to activate the first cancellation amplifier in connection with each read cycle.

8. The sense amplifier circuit of claim 3, wherein the sense amplifier circuit is configured to activate the first cancellation amplifier at least one of: (i) before a first read cycle following a transition from a standby mode to an active mode for a memory bank or (ii) during an interruption in a read cycle.

9. The sense amplifier circuit of claim 1, wherein the first leg comprises a first switch connected to a gate and a drain of a first p-channel transistor, and wherein the first switch is configured to selectively connect the drain of the first p-channel transistor to a voltage supply via a first capacitor.

10. The sense amplifier circuit of claim 1, further comprising:
a multiplexer configured to selectively couple a reference cell or the data cell to the first n-channel transistor and configured to selectively couple the reference cell or the data cell to the second n-channel transistor.

11. A magnetoresistive random access memory (MRAM) system, comprising:
a plurality of MRAM data cells; and
sense amplifier circuit for sensing a data state of a data cell of the plurality of MRAM data cells, the sense amplifier circuit comprising:
a first leg comprising a first n-channel transistor and a second leg comprising a second n-channel transistor, wherein the sense amplifier circuit is configured to perform a two-phase read comprising:
a first phase in which the first n-channel transistor is coupled to a reference resistance element and the second n-channel transistor is coupled to a data resistance element, and
a second phase in which the first n-channel transistor is coupled to the data resistance element and the second n-channel transistor is coupled to the reference resistance element;
a first active amplifier for controlling a gate voltage of the first n-channel transistor and a second active amplifier for controlling a gate voltage of the second n-channel transistor; and
a comparator circuit configured to output the data state of the data cell based on input of a first voltage related to a reference resistance and a second voltage related to a data resistance.

12. The system of claim 11, wherein the first active amplifier is configured to control the gate voltage of the first n-channel transistor based on feedback from the first n-channel transistor.

13. The system of claim 11, the sense amplifier circuit further comprising:
a first cancellation amplifier connected in parallel with the first active amplifier; and
a second cancellation amplifier connected in parallel with the second active amplifier.

14. The system of claim 13, wherein the first cancellation amplifier comprises a first input coupled to a first capacitor and a second input coupled to a second capacitor and wherein the first input is further coupled to a first switch configured to selectively couple the first input to a voltage source and wherein the second input is further coupled to a second switch configured to selectively couple the second input to feedback from the first n-channel transistor.

15. The system of claim 13, wherein the sense amplifier circuit is configured to activate the first cancellation amplifier in connection with each read cycle.

16. A method of reading data from a magnetoresistive random access memory (MRAM) system, comprising:
performing a two phase read of a data state of a data cell using a sense amplifier circuit, the sense amplifier circuit comprising:
a first leg comprising a first n-channel transistor;
a second leg comprising a second n-channel transistor;
a first active amplifier;
a second active amplifier; and
a comparator circuit;
wherein during a first phase of the two phase read the first n-channel transistor is coupled to a reference resistance element and the second n-channel transistor is coupled to a data resistance element,
wherein during a second phase of the two phase read the first n-channel transistor is coupled to the data resistance element and the second n-channel transistor is coupled to the reference resistance element,
wherein the first active amplifier is configured to control a gate voltage of the first n-channel transistor and the second active amplifier is configured to control a gate voltage of the second n-channel transistor, and
wherein the comparator circuit is configured to output the data state of the data cell based on input of a first voltage related to a reference resistance and a second voltage related to a data resistance.

17. The method of claim 16, wherein the first active amplifier is configured to control the gate voltage of the first n-channel transistor based on feedback from the first n-channel transistor.

18. The method of claim 16, wherein the sense amplifier circuit further comprises:
a first cancellation amplifier connected in parallel with the first active amplifier; and
a second cancellation amplifier connected in parallel with the second active amplifier.

19. The method of claim 18, wherein the first cancellation amplifier comprises a first input coupled to a first capacitor and a second input coupled to a second capacitor and wherein the first input is further coupled to a first switch configured to selectively couple the first input to a voltage source and wherein the second input is further coupled to a second switch configured to selectively couple the second input to feedback from the first n-channel transistor.

20. The method of claim 18, wherein the sense amplifier circuit is configured to activate the first cancellation amplifier in connection with each read cycle.

* * * * *